(12) United States Patent
Kim et al.

(10) Patent No.: US 10,026,790 B2
(45) Date of Patent: Jul. 17, 2018

(54) ORGANIC LIGHT-EMITTING DISPLAY DEVICE AND METHOD FOR MANUFACTURING THE SAME

(71) Applicant: LG Display Co., Ltd., Seoul (KR)

(72) Inventors: Binn Kim, Seoul (KR); BuYeol Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/495,480

(22) Filed: Sep. 24, 2014

(65) Prior Publication Data

US 2015/0097171 A1 Apr. 9, 2015

(30) Foreign Application Priority Data

Oct. 8, 2013 (KR) ........................ 10-2013-0120123

(51) Int. Cl.
| | | |
|---|---|---|
| *H01L 29/04* | (2006.01) | |
| *H01L 29/10* | (2006.01) | |
| *H01L 31/00* | (2006.01) | |
| *H01L 27/32* | (2006.01) | |
| *H01L 51/52* | (2006.01) | |

(52) U.S. Cl.
CPC ........ *H01L 27/3246* (2013.01); *H01L 27/326* (2013.01); *H01L 51/5228* (2013.01); *H01L 51/5234* (2013.01); *H01L 2251/5315* (2013.01)

(58) Field of Classification Search
CPC ............. H01L 51/0545; H01L 27/3276; H01L 27/32889; H01L 27/3297; H01L 51/5228; H01L 51/5203; H01L 51/5212; H01L 51/5215; B82Y 10/00

USPC ....... 257/40, 49, 59; 438/22, 28, 34, 35, 149
See application file for complete search history.

(56) References Cited

U.S. PATENT DOCUMENTS

| | | | | |
|---|---|---|---|---|
| 6,626,721 | B1 * | 9/2003 | Van Slyke | .......... H01L 27/3283 313/504 |
| 2002/0158835 | A1 * | 10/2002 | Kobayashi et al. | .......... 345/100 |
| 2004/0056591 | A1 * | 3/2004 | Koo | .................... H01L 27/3244 313/506 |

(Continued)

FOREIGN PATENT DOCUMENTS

| | | |
|---|---|---|
| CN | 1764337 A | 4/2006 |
| CN | 101751854 A | 6/2010 |

(Continued)

OTHER PUBLICATIONS

Office Action for Chinese Patent Application No. CN 201410514527.6, dated Nov. 28, 2016, 17 Pages.

(Continued)

*Primary Examiner* — Lex Malsawma
*Assistant Examiner* — Eric W Jones
(74) *Attorney, Agent, or Firm* — Fenwick & West LLP

(57) ABSTRACT

An organic light-emitting display device according to one embodiment of the present disclosure includes a substrate, a thin-film transistor formed on the substrate, a planarization layer formed on the thin-film transistor, an organic light-emitting element formed on the planarization layer, the emitting element including an organic light-emitting layer and a cathode, and a lower auxiliary wiring between the organic light-emitting element and the planarization layer, the wiring electrically connected with the cathode.

19 Claims, 10 Drawing Sheets

(56) References Cited

U.S. PATENT DOCUMENTS

| | | | |
|---|---|---|---|
| 2005/0051776 A1* | 3/2005 | Miyagi | G09G 3/3233 257/72 |
| 2005/0077816 A1* | 4/2005 | Yamada et al. | 313/503 |
| 2005/0253508 A1* | 11/2005 | Okano | H01L 27/3246 313/506 |
| 2006/0082284 A1* | 4/2006 | Shibusawa | H01L 27/12 313/500 |
| 2006/0113900 A1* | 6/2006 | Oh | H01L 27/3276 313/504 |
| 2006/0125390 A1* | 6/2006 | Oh | H01L 27/3276 313/506 |
| 2006/0232199 A1* | 10/2006 | Takahashi | H01L 51/5234 313/504 |
| 2007/0120785 A1* | 5/2007 | Kimura | G09G 3/3233 345/82 |
| 2007/0222380 A1* | 9/2007 | Yamazaki et al. | 313/509 |
| 2009/0009069 A1* | 1/2009 | Takata | H01L 27/3246 313/504 |
| 2009/0015153 A1* | 1/2009 | Asano | H01L 51/5237 313/504 |
| 2009/0284144 A1* | 11/2009 | Fujioka et al. | 313/504 |
| 2009/0302751 A1* | 12/2009 | Hanawa | 313/504 |
| 2010/0007272 A1* | 1/2010 | Toyoda | H01L 51/5203 313/504 |
| 2010/0060147 A1* | 3/2010 | Eom | H01L 51/5234 313/504 |
| 2010/0102335 A1* | 4/2010 | Takagi | H01L 27/3276 257/88 |
| 2010/0309101 A1* | 12/2010 | Kanegae et al. | 345/76 |
| 2011/0210335 A1 | 9/2011 | Miyagi et al. | |
| 2012/0074423 A1* | 3/2012 | Kanegae | 257/72 |
| 2012/0228603 A1* | 9/2012 | Nakamura | H01L 27/322 257/40 |
| 2013/0056784 A1* | 3/2013 | Lee | H01L 27/3246 257/99 |
| 2013/0069067 A1* | 3/2013 | Youn | H01L 27/3246 257/59 |
| 2013/0126860 A1* | 5/2013 | Fukuda | C08L 79/08 257/43 |
| 2014/0239262 A1* | 8/2014 | Kim | H01L 51/5212 257/40 |

FOREIGN PATENT DOCUMENTS

| | | |
|---|---|---|
| CN | 102741905 A | 10/2012 |
| CN | 102916030 | 2/2013 |

OTHER PUBLICATIONS

Office Action for Chinese Patent Application No. CN 201410514527.6, dated Jul. 24, 2017, 18 Pages, (With English Translation).

\* cited by examiner

ORGANIC LIGHT-EMITTING DISPLAY DEVICE AND METHOD FOR MANUFACTURING THE SAME

CROSS-REFERENCE TO RELATED APPLICATIONS

This application claims the priority of Korean Patent Application No. 10-2013-0120123 filed on Oct. 8, 2013, in the Korean Intellectual Property Office, the disclosure of which is incorporated herein by reference.

BACKGROUND

Field of Technology

The present disclosure relates to an organic light-emitting display device and a method for manufacturing the same, and more particularly, to an organic light-emitting display device which can solve problems regarding luminance non-uniformity and improve an aperture ratio in a pixel by using an auxiliary wiring and a method for manufacturing the same.

Description of the Related Art

Since an organic light-emitting display (OLED) device does not need a separate light source unlike a liquid crystal display (LCD) device, the OLED device can be manufactured in a lightweight and thin form. Further, the OLED device is advantageous in terms of power consumption since it is driven with a low voltage. Also, the OLED device has a high response speed, a wide viewing angle, and a high contrast ratio. Therefore, the OLED device has been studied as a next-generation display device.

SUMMARY

In the case of a top-emission type organic light-emitting display (OLED) device, an electrode having transparent or semi-transparent properties is used as a cathode in order to upwardly emit light emitted from an organic light-emitting layer. When an electrode having transparent or semi-transparent properties is used as a cathode, the cathode is formed to a thin thickness in order to improve transmittance. A reduction in thickness of a cathode causes an increase in electrical resistance of the cathode. Also, since the electrical resistance is proportional to a distance from a voltage supply, the electrical resistance of the cathode is gradually increased farther away from a voltage supply pad unit. When the electrical resistance of the cathode is increased, the voltage drop is further increased. In the embodiments herein, the voltage drop means a phenomenon where a potential difference generated in an organic light-emitting element is decreased. To be more specific, the voltage drop means a phenomenon where the potential difference between the anode and the cathode is decreased when a voltage of the cathode is raised by an increase of the electrical resistance of the cathode. The voltage drop may cause a problem regarding luminance non-uniformity of the organic light-emitting display device. In particular, as a size of the organic light-emitting display device is increased, the luminance non-uniformity is more severe.

In order to minimize a voltage drop, many methods using a separate auxiliary wiring have been used. When a separate auxiliary wiring is formed on the same plane with an anode of an organic light-emitting element, a light-emitting area in a pixel is decreased, because an area of the anode is relatively decreased.

Thus, an object of the present disclosure is to provide an OLED device capable of solving the above-mentioned luminance non-uniformity problem of an OLED device by minimizing a voltage drop in an organic light-emitting element, and a method for manufacturing the same.

Another object of the present disclosure is to provide an OLED device capable of solving the luminance non-uniformity problem of an OLED device while improving a light-emitting area and an aperture ratio in a pixel, and a method for manufacturing the OLED device.

A further object of the present disclosure is to provide an OLED device capable of minimizing a voltage drop while reducing an effect of a parasitic capacitance generated between an auxiliary wiring and a thin-film transistor, and a method for manufacturing the OLED device.

The objects of the present disclosure are not limited to the aforementioned objects, and other objects, which are not mentioned above, will be apparent to those skilled in the art from the following description.

According to an aspect of the present disclosure, there is provided an OLED device. The OLED device includes a substrate, a thin-film transistor, a planarization layer, an organic light-emitting element including an anode and an organic light-emitting layer and a cathode, and a lower auxiliary wiring. The thin-film transistor is formed on the substrate, and the planarization layer is formed on the thin-film transistor. Herein, the lower auxiliary wiring is arranged between the organic light-emitting element and the planarization layer and electrically connected with the cathode.

Since the cathode is connected with the lower auxiliary wiring and thus a resistance thereof decreases, it is possible to solve the luminance non-uniformity problem of an OLED device by minimizing a voltage drop in the organic light-emitting element.

Further, since the lower auxiliary wiring is arranged between the planarization layer and organic light-emitting element, it is possible to improve an aperture ratio in a pixel and reduce an effect of parasitic capacitance due to the lower auxiliary wiring.

Details of other exemplary embodiments are included in the detailed description and drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
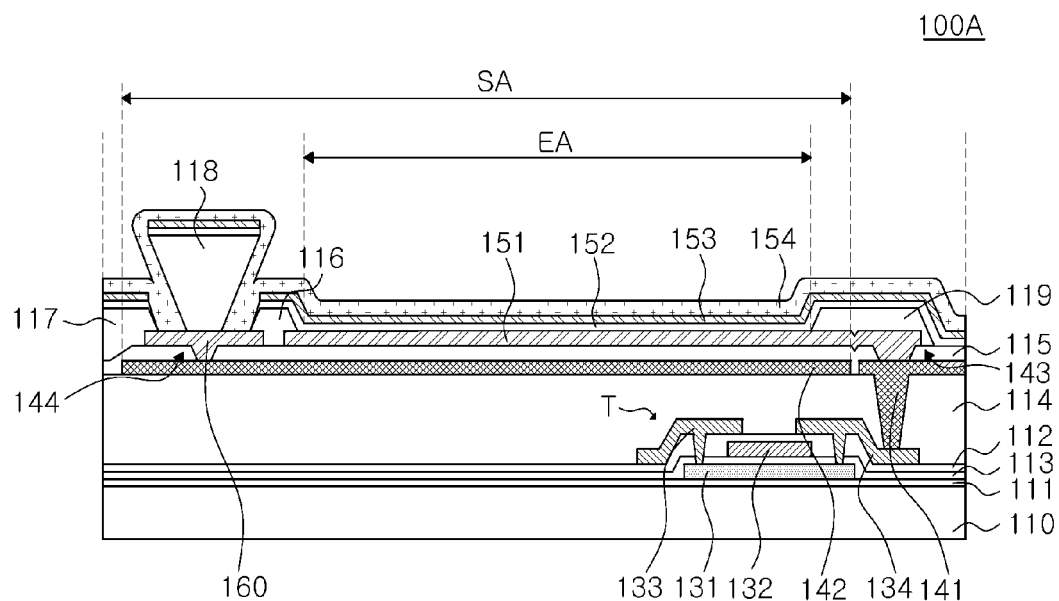
FIG. 1A and FIG. 1B are cross-sectional views of an organic light-emitting display device according to one embodiment.

Various advantages and features of the present disclosure and methods accomplishing thereof will become apparent from the following description of embodiments with reference to the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

Indicating that elements or layers are "on" other elements or layers include both a case in which the corresponding elements are just above other elements and a case in which the corresponding elements are intervened with other layers or elements. Indicating that elements or layers are "directly on" other elements or layers means a case in which the corresponding elements are just above other elements.

The same reference numerals indicate the same elements throughout the specification.

In the drawings, size and thickness of each element are arbitrarily illustrated for convenience of description, and the present disclosure is not necessarily limited to those illustrated in the drawings.

Although first, second, and the like are used in order to describe various components, the components are not limited by the terms. The above terms are used only to discriminate one component from the other component. Therefore, a first component mentioned below may be a second component within the technical spirit of the present disclosure.

Respective features of various exemplary embodiments of the present disclosure can be partially or totally joined or combined with each other and as sufficiently appreciated by those skilled in the art, various interworking or driving can be technologically achieved and the respective exemplary embodiments may be executed independently from each other or together executed through an association relationship.

Hereinafter, various exemplary embodiments of the present disclosure will be explained in detail with reference to the accompanying drawings.

FIG. 1A is a cross-sectional view of an organic light-emitting display device according to one embodiment.

Referring to FIG. 1A, an organic light-emitting display device 100A includes a substrate 110, a buffer layer 111, a gate insulating layer 113, an inter-insulating layer 112, a thin-film transistor T, a connection member 141, a lower auxiliary wiring 142, an anode 151, a planarization layer 114, an additional insulating layer 115, bank layers 116, 117, and 119, a separation wall 118, an organic light-emitting layer 152, a cathode 153, a transparent conductive layer 154, and an upper auxiliary wiring 160. A thin-film transistor T includes an active layer 131, a gate electrode 132, a source electrode 133 and a drain electrode 134.

The organic light-emitting display device 100A according to one embodiment; is a top-emission type organic light-emitting display device. In the top-emission type organic light-emitting display device 100A, the anode 151 includes a reflective layer, and the light emitted from the organic light-emitting layer 152 is emitted through the cathode 153 having transparent or semi-transparent properties.

The organic light-emitting display device 100A includes a light-emitting area EA and an auxiliary wiring area SA. The light-emitting area EA refers to a region in which light is emitted from the organic light-emitting layer 152. For example, referring to FIG. 1A, the light-emitting area EA is defined by the bank layers 116 and 119 at the edges of the anode 151. The auxiliary wiring area SA refers to a region where the lower auxiliary wiring 142 is formed.

The buffer layer 111 is formed on the substrate 110, and the thin-film transistor T is formed on the buffer layer 111. To be more specific, the active layer 131 is formed on the buffer layer 111 and the gate insulating layer 113 is formed thereon. The gate electrode 132 is formed on the gate insulating layer 113 and the inter-insulating layer 112 is formed on the entire surface thereof. The source electrode 133 and the drain electrode 134 are electrically connected with the active layer 131 through contact-holes of the inter-insulating layer 112 and the gate insulating layer 113.

The thin-film transistor T has a coplanar structure including the active layer 131, the gate electrode 132, the source electrode 133, and the drain electrode 134. The coplanar thin-film transistor T has a structure in which the source electrode 133, the drain electrode 134, and the gate electrode 132 are arranged above or under the active layer 131. Although, in the embodiments herein, the thin-film transistor T has a coplanar structure, the present disclosure is not limited thereto. The thin-film transistor T may employ various structures.

Further, although, in the embodiments herein, the anode 151 is connected with the drain electrode 134 when the thin-film transistor T is a P-type thin-film transistor T, the present disclosure is not limited thereto. For example, when the thin-film transistor T is an N-type thin-film transistor, the anode 151 may be connected with the source electrode 133.

Referring to FIG. 1A, the planarization layer 114 is formed on the thin-film transistor T. The planarization layer 114 protects elements arranged under the planarization layer 114 and also provides a planar surface over the thin-film transistor T to easily form other elements on the thin-film transistor T. In the organic light-emitting display device 100A, the planarization layer 114 is sufficiently thick to provide a planar surface over the thin-film transistor T to form an organic light-emitting element including the anode 151, the organic light-emitting layer 152 and the cathode 153. The planarization layer 114 is formed of one or more materials of, but not limited to a polyacrylates resin, an epoxy resin, a phenolic resin, a polyamides resin, a polyimides resin, an unsaturated polyesters resin, a poly-phenylenethers resin, a poly-phenylenesulfides resin, and benzocyclobutene. Further, the planarization layer 114 may be formed of various other organic materials. Also, the planarization layer 114 is formed to have contact-holes through which the drain electrode 134 is exposed.

The connection member 141 and the lower auxiliary wiring 142 are formed on the planarization layer 114.

The lower auxiliary wiring 142 is electrically connected with the cathode 153 and is formed of a conductive material so as to minimize a voltage drop due to a resistance of the cathode 153. Further, the lower auxiliary wiring 142 may be extended to be electrically connected with a voltage supply pad unit at a non-display region. The lower auxiliary wiring 142 may receive a preset voltage, and the preset voltage may be the same voltage as that of the cathode 153, for example, a ground (GND) or negative voltage.

The lower auxiliary wiring 142 can decrease a resistance of the cathode 153 electrically connected thereto. To be specific, the lower auxiliary wiring 152 connected to the cathode 153 is configured to receive the same voltage as that of the cathode 153 from the voltage supply pad unit. That is, for a given pixel, the resistance of the cathode 153 can be decreased by being connected to the lower auxiliary wiring 152. A decrease in resistance of the cathode 153 can lead to a decrease in a voltage drop that a potential difference between the anode 151 and the cathode 153 is deceased. Accordingly, even if the voltage drop occurs due to the resistance of the cathode 153, the lower auxiliary wiring 152 connected to the cathode 153 allows for the application of the required voltage to the pixel. The lower auxiliary wiring 142 may be formed to have a width and a thickness based on a size of the organic light-emitting display device so as to decrease the voltage drop. A resistance of the lower auxiliary wiring 142 can be calculated based on a width, a length, a thickness, a material, and like of the lower auxiliary wiring 142.

As described above, the lower auxiliary wiring 142 is formed on the planarization layer 114, which is substantially planar. That is, the lower auxiliary wiring 142 is formed on a top surface of the planarization layer 114 such that the lower auxiliary wiring 142 is planar. In this way, the lower auxiliary wiring 142 is formed so as not to have stepped portions. For example, when the lower auxiliary wiring 142 is formed on a passivation layer consisting of an inorganic material, the lower auxiliary wiring 142 may have stepped portions. Because, it is difficult that the passivation layer has sufficient thickness to provide a planar cover for other elements under the passivation layer.

Further, the organic light-emitting display device 100A has various advantages as compared with a structure having the lower auxiliary wiring 142 formed under the top surface of the planarization layer 114. When the lower auxiliary wiring 142 is formed under the top surface of the planarization layer 114 and closer to the transistor T, a parasitic capacitance may be generated between the lower auxiliary wiring 142 of a conductive material and the components of the thin-film transistor T. However, as illustrated in FIG. 1A, by placing the lower auxiliary wiring 142 on the top surface of the planarization layer 114, a sufficient distance between the lower auxiliary wiring 142 and the components of the thin-film transistor T can be provided to minimize a parasitic capacitance.

As one example where the lower auxiliary wiring 142 is not formed on the planarization layer 114, the lower auxiliary wiring 142 may be formed directly on the passivation layer covering the thin-film transistor T. More specifically, the passivation layer is formed on the components of the thin-film transistor T and the lower auxiliary wiring 142 is formed directly on the passivation layer. In this case, a high parasitic capacitance may be generated between the lower auxiliary wiring 142 and the components of the thin-film transistor T. Such a high parasitic capacitance may cause deterioration in performance of the thin-film transistor T.

However, as illustrated in FIG. 1A, when the lower auxiliary wiring 142 is formed on the planarization layer 114, a sufficient distance can be maintained between the lower auxiliary wiring 142 and the planarization layer 114. Therefore, a parasitic capacitance may be lower than the structure in which the lower auxiliary wiring 142 is formed directly on the passivation layer.

In this regard, the planarization layer 114 should have a sufficient thickness to minimize an effect of a parasitic capacitance generated between the lower auxiliary wiring 142 and the thin-film transistor T. For instance, a gate charge voltage may vary or crosstalk may be generated if the parasitic capacitance between the lower auxiliary wiring 142 and the thin-film transistor T is above 0.1 fF per unit area ($\mu m^2$), and it results in deterioration in characteristics of the thin-film transistor T. Accordingly, in one embodiment, the planarization layer 114 may have a thickness such that a parasitic capacitance between the thin-film transistor T and the lower auxiliary wiring 142 may be desirably 0.1 fF (femto farad) or less per unit area ($\mu m^2$). By making the parasitic capacitance between the lower auxiliary wiring 142 and the thin-film transistor T to be 0.1 fF or less per unit area ($\mu m^2$), undesirable effects, which may be caused by the lower auxiliary wiring 142, can be minimized.

Referring to FIG. 1A, the lower auxiliary wiring 142 is arranged between the anode 151 of the organic light-emitting element and the planarization layer 114, and also the lower auxiliary wiring 142 is formed in the auxiliary wiring area SA so as to be partially overlapped with the light-emitting area EA. The light-emitting area EA can be defined as a region extending between a first side of the bank layer 116 formed at one end of the anode 151 and a second side of the bank layer 119 formed at the other opposing end of the anode 151, the first side facing the second side. Further, the light-emitting area EA may refer to an entire anode 151 region except for the anode 151 regions covered with the bank layers 116 and 119. The light-emitting area EA may refer to an anode 151 region where the organic light-emitting layer 152 is in direct contact with the anode 151. Also, the light-emitting area EA is opened between the bank layers 116 and 119 and may defined by the bank layers 116 and 119. Further, the light-emitting area EA may be partially overlapped with the anode 151 region.

The lower auxiliary wiring 142 is not formed on the same plane with the anode 151, but is formed beneath the anode 151. Accordingly, the size of the anode 151 region is not dependent on the size of the lower auxiliary wiring 142, and thus, the anode 151 region can be increased to provide a larger light-emitting area EA.

Hence, the positioning of the lower auxiliary wiring 142 between the planarization layer 114 and the organic light-emitting element may be optimized, when considering the performance of the thin-film transistor T, the reduction of the voltage drop of the organic light-emitting element, and the extension of the light-emitting area EA.

The connection member 141 is electrically connected with the drain electrode 134 via a contact-hole of the planarization layer 114 to which the drain electrode 134 is exposed. The connection member 141 is configured to electrically connect the drain electrode 134 and the anode 151 with each other. The connection member 141 may be formed in a minimum volume as long as electrically connecting the drain electrode 134 and the anode 151 with each other. By the minimum volume, the lower auxiliary wiring 142 area can be maximized.

The anode 151 and the drain electrode 134 may be directly and electrically connected with each other without the connection member 141. However, in order to directly and electrically connect the anode 151 with the drain electrode 134, it is necessary to form contact-holes in both of the planarization layer 114 and the additional insulating layer 115. Therefore, a shape of the contact-holes may not be formed accurately, resulting in a problem with the electrical connection between the anode 151 and the drain electrode 134. Further, even when the contact-holes may be formed accurately, there may occur, due to a considerable depth of the contact-holes, a problem with the electrical connection between the anode 151 and the drain electrode 134. Accordingly, in the organic light-emitting display device 100A according to one embodiment, the connection member 141 is formed between the drain electrode 134 and the anode 151, facilitating the electrical connection of the drain electrode 134 with the anode 151.

The connection member 141 and the lower auxiliary wiring 142 may be formed of, but not limited to, any one of molybdenum (Mo), aluminum (Al), chromium (Cr), gold (Au), titanium (Ti), nickel (Ni), neodymium (Nd), and copper (Cu), alloys of thereof, or multilayers thereof. Further, the connection member 141 may be formed of various materials. The lower auxiliary wiring 142 may be formed of the same material, at the same time, as the connection member 141. And the connection member 141 is formed on the same plane with the lower auxiliary wiring 142.

The additional insulating layer 115 is formed on the connection member 141 and the lower auxiliary wiring 142 entirely over the substrate 110. The additional insulating layer 115 is formed to insulate the lower auxiliary wiring 142 from the anode 151. Further, the additional insulating layer 115 may have contact-holes 143 and 144 formed therethrough, the contact-hole 143 opening a portion of the connection member 141, and the contact-hole 144 opening a portion of the lower auxiliary wiring 142.

The additional insulating layer 115 may be formed of, but not limited to, a silicon oxide layer, a silicon nitride layer, or a double layer thereof. The additional insulating layer 115 may be formed of various inorganic materials. When the additional insulating layer 115 may be formed of an inorganic material, the anode 151 above and between the lower auxiliary wiring 142 and the connection member 141 has a step as illustrated in FIG. 1. Thus, the bank layer 119 is formed so as to cover the step of the anode 151 above and between the lower auxiliary wiring 142 and the connection member 141.

Further, the additional insulating layer 115 may provide a planar cover for the connection member 141 and the lower auxiliary wiring 142 so as to allow for easy formation of other elements over the connection member 141 and the lower auxiliary wiring 142. In one embodiment, the additional insulating layer 115 may be formed of the same material as the planarization layer 114. When the additional insulating layer 115 is formed to perform the same function as the planarization layer 114, the additional insulating layer 115 may provide a planar cover for the connection member 141 and the lower auxiliary wiring 142. When the additional insulating layer 115 provides a planar cover for the connection member 141 and the lower auxiliary wiring 142, the bank layer 119 may be formed so as to cover only the contact-hole 143 through which the anode 151 is in contact with the connection member 141. It is not necessary to form the bank layer 119 to cover the anode 151 region above and between the lower auxiliary wiring 142 and the connection member 141. Therefore, when the additional insulating layer 115 provides a planar cover for the lower auxiliary wiring 142, a bank layer 119 region may be reduced, and, thus, the light-emitting area EA defined by the bank layers 119 and 116 may be further extended.

The organic light-emitting element including the anode 151, the organic light-emitting layer 152, and the cathode 153 is formed on the additional insulating layer. The organic light-emitting display device 100A is driven to display an image via a recombination between a hole supplied from the anode 151 and an electron supplied from the cathode 153 in the organic light-emitting layer 152 to emit light. The organic light-emitting display device 100A has sub-pixels which are independently driven. Therefore, one above-described thin-film transistor T and one organic light-emitting element both are arranged at each sub-pixel region. One thin-film transistor T in each sub-pixel region can independently drive a corresponding organic light-emitting element.

The anode 151 is formed on the additional insulating layer 115. The anode 151 is electrically connected with the connection member 141 via the contact-hole 143 in the additional insulating layer 115 which is electrically connected with the drain electrode 134 via the connection member 141.

The anode 151 needs to supply a hole. Therefore, it is formed of a conductive material having a high work function. The anode 151 includes a transparent layer having a high work function, and the transparent layer is formed of a transparent conductive oxide (TCO) such as an indium tin oxide (ITO), and an indium zinc oxide (IZO). Although not illustrated in FIG. 1A, the anode 151 may include a reflective layer formed under the transparent layer. The anode 151 is formed to be segmented into a plurality of pieces respectively corresponding to sub-pixel regions. That is, each anode 151 is electrically connected to each the thin-film transistor T, and, thus, each sub-pixel region can be independently driven.

The upper auxiliary wiring 160 is formed on the same plane with the anode 151. The upper auxiliary wiring 160 is formed of a conductive material so as to electrically connect the cathode 153 with the lower auxiliary wiring 142.

The upper auxiliary wiring 160 may be formed in the same process at the same time as the anode 151. In this case, the upper auxiliary wiring 160 is formed of the same material with the same thickness at the same time as the anode 151. As described above, when the anode 151 is formed of the transparent layer and the reflective layer, the upper auxiliary wiring 160 may be formed of a transparent layer and a reflective layer.

An extended end of the upper auxiliary wiring 160 is electrically connected with the voltage supply pad unit provided at the non-display region. Thus, the upper auxiliary wiring 160 receives a preset voltage. The preset voltage may be the same voltage as that of the cathode 153, for example, a ground (GND) or negative voltage. When the upper auxiliary wiring 160 is formed, it is possible to minimize damage which may occur to the lower auxiliary wiring 142 by an etchant when the anode 151 is patterned.

An area of the upper auxiliary wiring 160 can be determined depending on an area of the anode 151. Since the upper auxiliary wiring 160 is formed on the same plane with the anode 151, there is a trade-off relationship between an area of the upper auxiliary wiring 160 and an area of the light-emitting area EA of the organic light-emitting element. Therefore, when an area of the upper auxiliary wiring 160 is minimized, an area of the light-emitting area EA can be increased. Thus, the upper auxiliary wiring 160 can be formed at a minimum space where the separation wall 118 can be formed. For example, the upper auxiliary wiring 160 may be formed at a minimum space in a polygonal shape so as to connect the cathode 153 with the lower auxiliary wiring 142. When the upper auxiliary wiring 160 is formed only at a partial region and cannot be connected with a voltage supply pad unit, the lower auxiliary wiring 142 may be directly connected with the voltage supply pad unit and thus may be applied with a preset voltage which is the same voltage as that of the cathode 153.

The bank layers 116 and 117 are formed on both sides of the upper auxiliary wiring 160. The bank layer 116 covers one side of the upper auxiliary wiring 160 and one side of the anode 151 in the light-emitting area EA. The bank layer 117 covers the other side of the upper auxiliary wiring 160.

The bank layers 116, 117, and 119 may be formed of an organic insulating material, for example, any one of polyimide, photo acryl, and benzocyclobutene (BCB). The bank layers 116, 117, and 119 may be formed in a tapered shape. Hereinafter, a tapered shape refers to a shape gradually decreasing in cross-sectional area farther away from the substrate 110. On the contrary to this, a reverse tapered shape refers to a shape gradually increasing in cross-sectional area farther away from the substrate 110.

When the bank layers 116, 117, and 119 are formed in a tapered shape, the bank layers 116, 117, and 119 are formed of a photoresist. The bank layers 116, 117, and 119 are formed to a height for distinguishing the adjacent light-emitting area EA.

The bank layer 119 is formed so as to cover the contact-hole 143 through which the anode 151 is connected with the connection member 141. Although not illustrated in FIG. 1A, a region of the anode 151 corresponding to the contact-hole 143 may have a stepped portion. The stepped portion of the anode 151 caused by the contact-hole 143 may cause light leakage of sub-pixels or the like. Since the bank layer 119 is formed so as to cover the contact-hole 143, visibility of the organic light-emitting display device 100A can be improved. Further, the bank layer 119 is formed so as to cover a part of the lower auxiliary wiring 142. When the bank layer 119 covers a part of the lower auxiliary wiring 142, it is formed so as to cover a stepped portion of the anode 151 caused by a stepped portion of the additional insulating layer 115. Therefore, it is possible to minimize light leakage or the like.

The separation wall 118 is formed on the upper auxiliary wiring 160. The separation wall 118 is formed so as to sever the organic light-emitting layer 152. The separation wall 118 is formed in a reverse tapered shape. Referring to FIG. 1A, a lower surface of the separation wall 118 is in contact with a portion of the upper auxiliary wiring 160. A cross-sectional area of the separation wall 118 is gradually increased farther away from the upper auxiliary wiring 160, and, thus, an area of an upper surface of the separation wall 118 may be greater than an area of a lower surface of the separation wall 118. The separation wall 118 may be formed higher than the bank layers 116 and 117 and may be formed with a height of, for example, about 1 μm to about 2.5 μm. When the separation wall 118 is formed higher than the bank layers 116 and 117, it may become easier to form the separation wall 118 in a reverse tapered shape.

The organic light-emitting layer 152 is formed on the anode 151, the bank layers 116, 117, and 119, and the separation wall 118. The organic light-emitting layer 152 is formed in the light-emitting area EA. Since the organic light-emitting layer 152 is formed on the anode 151 on the substantially planar lower auxiliary wiring 142, it is substantially planar. To be specific, the organic light-emitting layer 152 may be formed by depositing an organic light-emitting material. In general, the organic light-emitting material is formed of a material with low step coverage. Due to the low step coverage of the organic light-emitting material, the organic light-emitting material is not formed on side surfaces of the separation wall 118 and the bank layers 116 and 117, but formed on upper surfaces of the separation wall 118 and the bank layers 116 and 117. Since the organic light-emitting layer 152 is not deposited on a portion of the upper auxiliary wiring 160, it is possible to obtain a physical space that enables the upper auxiliary wiring 160 and the cathode 153 to be electrically connected.

A method for electrically connecting the cathode 153 with the upper auxiliary wiring 160 or the lower auxiliary wiring 142 by patterning the organic light-emitting layer 152 in the organic light-emitting display device 100A is not limited. In the embodiments herein, the physical space that enables the upper auxiliary wiring 160 or the lower auxiliary wiring 142, and the cathode 153 to be electrically connected is obtained by forming the separation wall 118 in a reverse tapered shape. But a shadow mask including an FMM (Fine Metal Mask) may be used. To be specific, the organic light-emitting layer 152 may be formed by using the shadow mask including the FMM having an opening corresponding to the light-emitting area EA. Since the organic light-emitting layer 152 is not formed at a portion of the upper auxiliary wiring 160 or lower auxiliary wiring 142, the cathode 153 may be directly and electrically connected with the upper auxiliary wiring 160 or the lower auxiliary wiring 142 without a separation wall 118.

Further, in order to form the organic light-emitting layer 152 as described above, the organic light-emitting layer 152 may be formed through a photoresist process. For example, the organic light-emitting layer 152 may be formed through a photoresist process using a photoresist pattern formed of a fluorine-containing material, a developing solution, and a stripper. In order to form the organic light-emitting layer 152, a mask-free method such as LITI (Laser Induced Thermal Imaging), LIPS (Laser Induced Pattern-wise Sublimation), Soluble Printing, and the like, may be used.

The cathode 153 is formed on the organic light-emitting layer 152. The cathode 153 is connected with a separate voltage wiring, for example, a voltage supply pad unit, so as to apply a constant voltage to all sub-pixels. Since the cathode 153 needs to supply electrons, it is formed of a material having a high electrical conductivity and a low work function. Since the organic light-emitting display device 100A is a top-emission type organic light-emitting display device, the cathode 153 is formed of a metallic material having a thin thickness and a low work function. For example, the cathode 153 is formed of silver (Ag), titanium (Ti), aluminum (Al), molybdenum (Mo, or an alloy of silver (Ag) and magnesium (Mg). The cathode 153 is formed to a thickness of several hundred Å (angstrom) or less, for example, 200 Å or less. When the cathode 153 is formed as such, the cathode 153 becomes a substantially electrode having transparent or semi-transparent properties.

A resistance of the cathode 153 in the organic light-emitting display device has a great effect on luminance uniformity. An increase in thickness of the cathode 153 exhibits a trade-off, so that a resistance of the cathode 153 is reduced or a transmittance of the cathode 153 is lowered. Therefore, when a thickness of the cathode 153 is increased to a preset level or more in order to lower a resistance of the cathode 153, there is a limit due to characteristics of the top-emission type organic light-emitting display device 100A. In other words, when a thickness of the cathode 153 is increased, the voltage drop is reduced due to the decrease of the resistance of the cathode 153, and thus luminance uniformity is improved. But, transmittance of the organic light-emitting display device 100A is lowered. So, in organic light-emitting display device 100A according to the exemplary embodiment of the present disclosure, the resistance of the cathode 153 may be lowered by using the lower auxiliary wiring 142 electrically connected with the cathode 153 instead of increasing a thickness of the cathode 153.

Referring to FIG. 1A, since the cathode 153 is formed of the above-described metallic material and is not directly connected with the upper auxiliary wiring 160 due to the separation wall 180, the transparent conductive layer 154 is additionally formed on the cathode 153. The transparent conductive layer 154 is formed throughout the light-emitting area EA and a region where the upper auxiliary wiring 160 is formed. The transparent conductive layer 154 is formed of a transparent conductive material. The transparent conductive layer 154 is formed by depositing a transparent conductive oxide. Since a transparent conductive oxide is formed of a material with high step coverage, the transparent conductive layer 154 may be formed on the side surfaces and upper surfaces of the separation wall 118 and the bank layers 116 and 117. Therefore, the transparent conductive layer 154 electrically connects the cathode 153 with the upper auxiliary wiring 160. The transparent conductive layer 154 should be formed to a sufficient thickness on the side surfaces of the separation wall 118 and the bank layers 116 and 117 for stable electrical connection. For example, the transparent conductive layer 154 may be formed to a thickness of about 100 Å or more. Examples of the transparent conductive oxide used for the transparent conductive layer 154 may include an indium tin oxide (ITO), an indium zinc oxide (IZO), an indium tin zinc oxide (ITZO), a zinc oxide, a tin oxide, and the like.

However, when the cathode 153 is formed of a material with high step coverage, the cathode 153 may be directly connected with the upper auxiliary wiring 160 through a space between the separation wall 118 and the bank layer 116 without the transparent conductive layer 154.

Figure 1B:
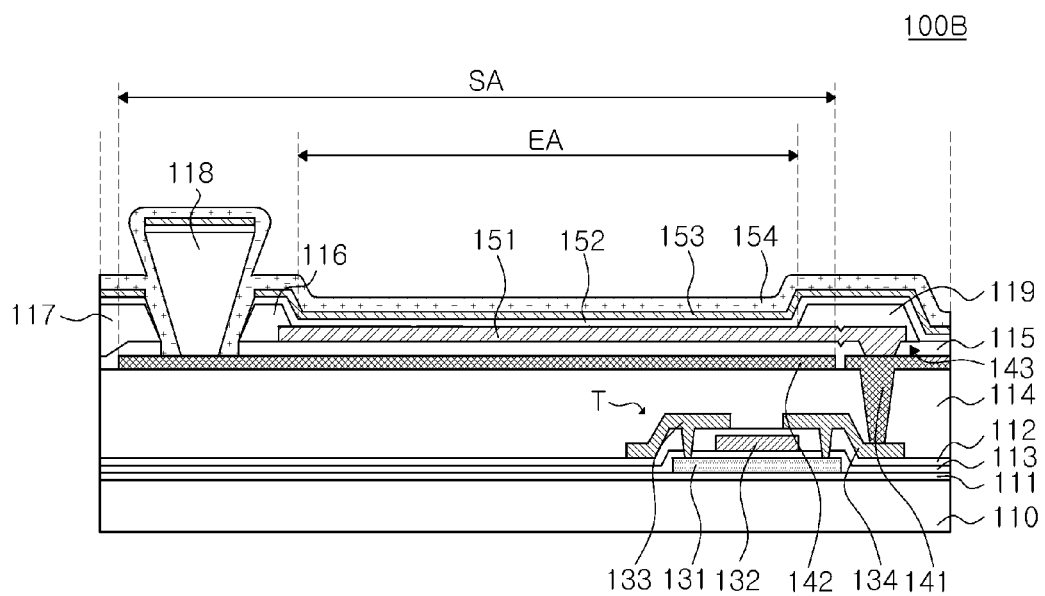

FIG. 1B is a cross-sectional view of an organic light-emitting display device according to one embodiment. Among components of an organic light-emitting display device 100B illustrated in FIG. 1B, some components substantially the same as those of the organic light-emitting display device 100A illustrated in FIG. 1A will be omitted in explanation.

FIG. 1B illustrates the organic light-emitting display device 100B in which the lower auxiliary wiring 142 is electrically connected with the cathode 153 without the upper auxiliary wiring 160. As described above, since there is a trade-off relationship between the upper auxiliary wiring 160 and the anode 151, when the upper auxiliary wiring 160 is not formed, it is possible to obtain the anode 151 having a greater area. Therefore, the light-emitting area EA can be further extended.

In FIG. 1B, the lower auxiliary wiring 142 is electrically connected with the cathode 153 by using the separation wall 118, but a connection method is not limited thereto. Various methods may be employed.

Figure 1C:
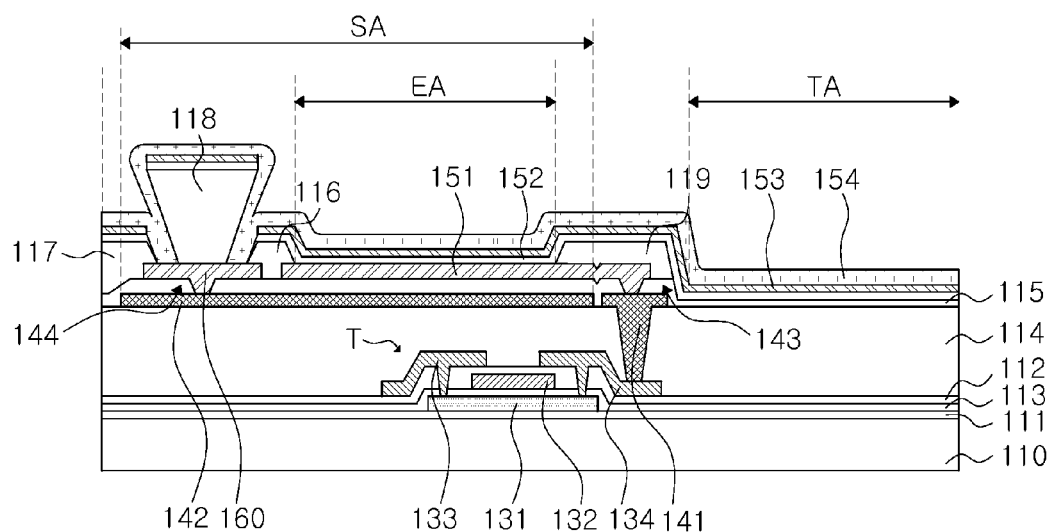
FIG. 1C is a cross-sectional view of a transparent organic light-emitting display device according to one embodiment.

FIG. 1C is a cross-sectional view of an organic light-emitting display device 100C that is a transparent organic light-emitting display device according to one embodiment. Among components of a transparent organic light-emitting display device 100C illustrated in FIG. 1C, some components substantially the same as those of the organic light-emitting display device 100A illustrated in FIG. 1A will be omitted in explanation.

Referring to FIG. 1C, the transparent organic light-emitting display device 100C further includes a light-transmitting area TA. The transparent organic light-emitting display device 100C has a transmittance that enables a user to at least recognize an object behind the transparent organic light-emitting display device 100C. For example, the transparent organic light-emitting display device 100C has a transmittance of at least 20% or more.

The lower auxiliary wiring 142 is formed so as to be overlapped with the light-emitting area EA. Since the lower auxiliary wiring 142 is formed of an opaque material, it is not formed in the light-transmitting area TA in order to increase a transmittance of the transparent organic light-emitting display device 100C. The upper auxiliary wiring 160 may be or may not be used. Even when used, the upper auxiliary wiring 160 may be formed at a minimum space. In the transparent organic light-emitting display device 100C according to the exemplary embodiment of the present disclosure, the lower auxiliary wiring 142 is formed under the light-emitting area EA. Therefore, it is possible to obtain the light-emitting area EA and the light-transmitting area TA as large as possible.

Further, the organic light-emitting layer 152, the cathode 153, and the transparent conductive layer 154 are formed so as to be overlapped with a part of the light-transmitting area TA. However, desirably, the organic light-emitting layer 152, the cathode 153, or the transparent conductive layer 154 may also be patterned so as not to be formed in the light-transmitting area TA by various patterning methods as described above. In this case, a transmittance of the light-transmitting area TA may be further improved.

Figure 2:
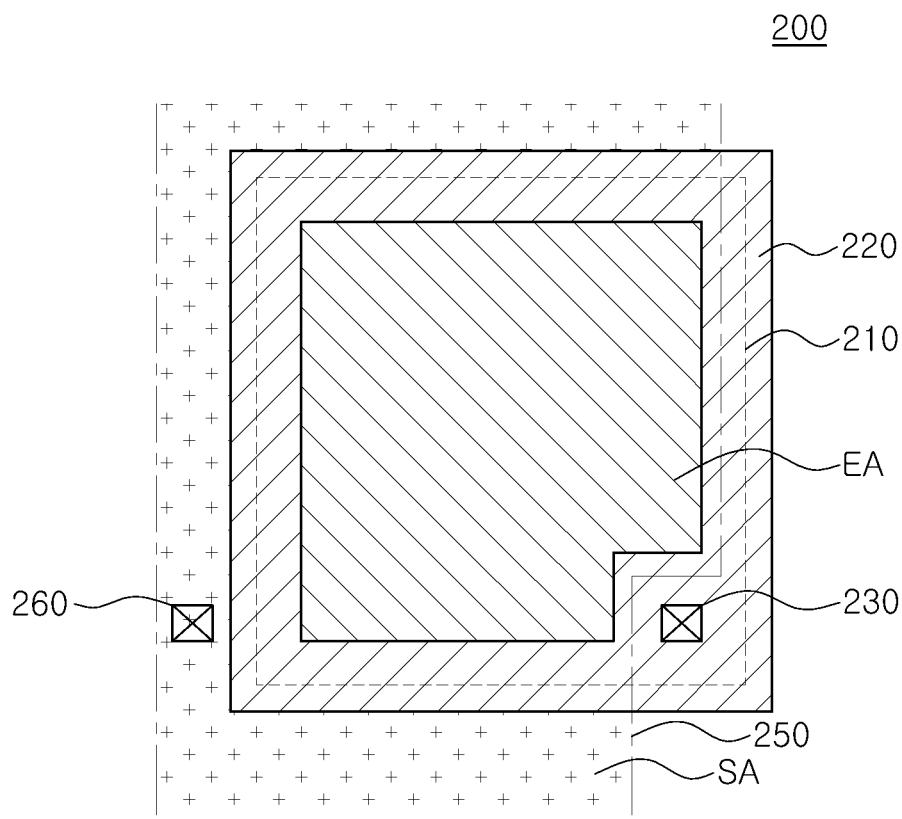
FIG. 2 is a plane view of an organic light-emitting display device according to one embodiment.

FIG. 2 is a plane view of an organic light-emitting display device according to one embodiment. FIG. 2 schematically illustrates a plane view of a configuration of an organic light-emitting display device 200 according to one embodiment. The components described herein can be formed in various manners without limitation in arrangement of the components illustrated in FIG. 2.

FIG. 2 illustrates a region where an anode 210 is formed, a region where a bank layer 220 is formed, a light-emitting area EA partitioned by the bank layer 220, a contact-hole 230 through which the anode 210 is connected with a thin-film transistor. FIG. 2 also illustrates an auxiliary wiring area SA where a lower auxiliary wiring 250 is formed, and a contact-hole 260 through which the lower auxiliary wiring 250 is connected with a cathode. The light-emitting area EA overlaps the lower auxiliary wiring 250. The bank layer 220 is formed so as to surround the anode 210 and also cover the contact-hole 230 through which the anode 210 is connected with the thin-film transistor and a part of the lower auxiliary wiring 250.

Since the light-emitting area EA is partitioned by the bank layer 220 formed on the anode 210, the light-emitting area EA is formed at a space narrower than the region where the anode 210 is formed. The light-emitting area EA is formed to be included in the auxiliary wiring area SA such that the light-emitting area EA on the anode 210 can be planar.

Furthermore, the anode 210 is not formed in the contact-hole 260 through which the lower auxiliary wiring 250 is in contact with the cathode. As illustrated in FIG. 1A, as a region where the lower auxiliary wiring 250 is in contact with the cathode is decreased, a region where the anode 210 can be formed is increased. Therefore, the light-emitting area EA can be extended.

Figure 3A:
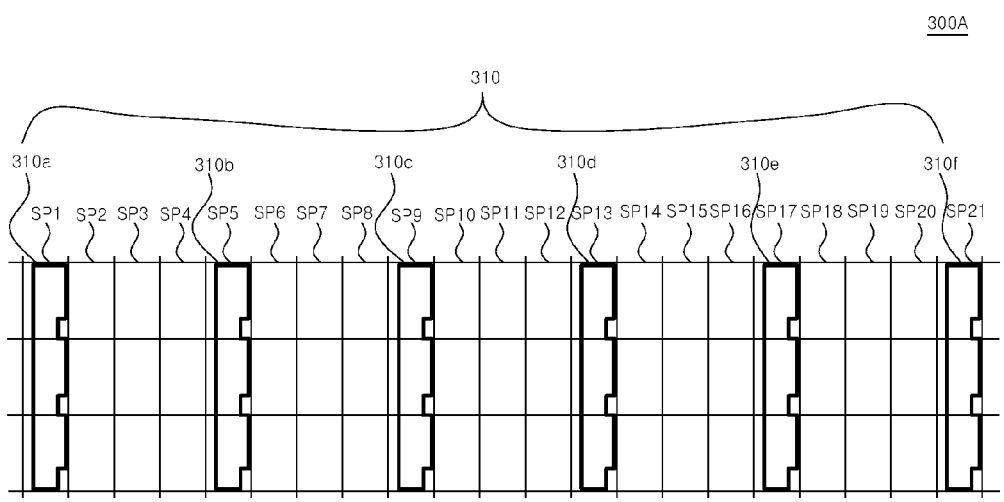
FIG. 3A to FIG. 3C are plane views of an organic light-emitting display device according one embodiment.
Figure 3B:
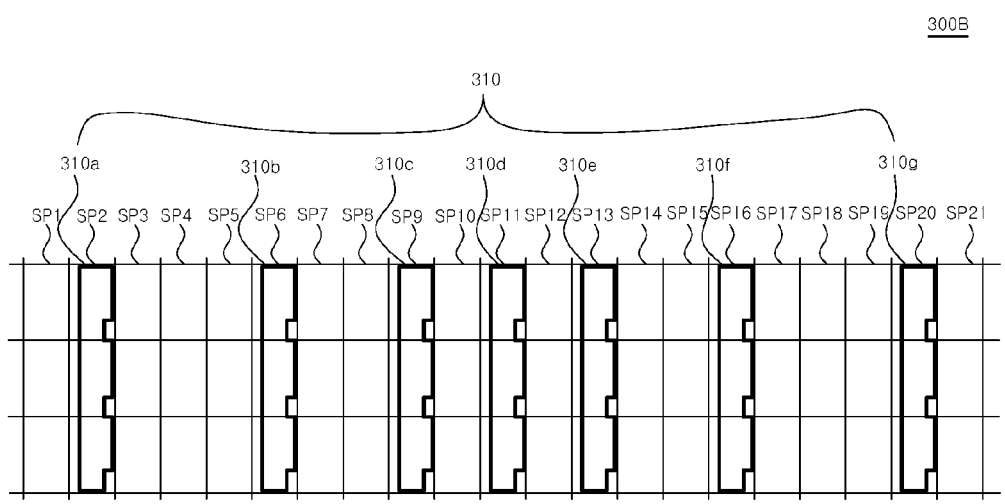

FIG. 3A is a plane view of an organic light-emitting display device according to one embodiment. A lower auxiliary wiring 310 (e.g., 310a, 310b, 310c, 310d, 310e, 310f) may be formed at all sub-pixels, or may be formed at some sub-pixels as illustrated in FIG. 3A and FIG. 3B. Since the lower auxiliary wiring 310 is provided for the purpose of reducing a voltage drop of an organic light-emitting element, the lower auxiliary wiring 310 may be formed only at a specific sub-pixel among a plurality of sub-pixels as long as such a purpose can be achieved.

Referring to FIGS. 3A and 3B, organic light-emitting display devices 300A and 300B include a plurality of sub-pixels SP1 to SP21. The lower auxiliary wiring 310 may be periodically arranged across the substrate.

In FIG. 3A, the lower auxiliary wiring 310 may be periodically arranged at each nth sub-pixel (n is a natural number) across the substrate. FIG. 3A illustrates that lower auxiliary wirings 310b, 310c, 310d, 310e, and 310f are formed at every 4th sub-pixel SP5, SP9, SP13, SP17, and SP21 among the plurality of sub-pixels, and the lower auxiliary wiring 310 is not formed at the other sub-pixels. At the other sub-pixels where the lower auxiliary wiring 310 is not formed, there is no contact region of the lower auxiliary wiring 310 with the cathode. Therefore, the light-emitting area EA can be further extended. The lower auxiliary wiring 310 is formed so as to be extended to a non-display region of the organic light-emitting display device 300A and applied with a preset voltage. Since the lower auxiliary wirings 310 are periodically arranged across the substrate, the organic light-emitting display device 300A can be efficiently designed.

A voltage drop in an organic light-emitting display device may occur around the center of the display device. This may be because a resistance of a cathode is gradually decreased farther away from a voltage supply pad unit. Therefore, in an organic light-emitting display device according to one embodiment, a lower auxiliary wiring may be formed around a region where a voltage drop remarkably occurs in order to reduce a resistance of the cathode. For example, the pitch of the lower auxiliary wiring placement may be narrowed down towards the central portion of the organic light-emitting display device. That is, a distance between two adjacent lower auxiliary wirings located in central portion of the organic light-emitting display device 300B may be lower than a distance between two adjacent lower auxiliary wirings positioned in a peripheral portion of the organic light-emitting display device 300B. As shown in FIG. 3B, the lower auxiliary wirings 310c, 310d and 310e at pixels SP9, SP11 and SP13, respectively, are more closely placed between each other in comparison to the placement of lower auxiliary wirings 310a and 310b, or the placement of lower auxiliary wirings 310f and 310g. By reducing the pitch of lower auxiliary wiring placement towards the central portion, where the display is more likely to be affected by voltage drop, more efficient management of the voltage drop issue in the display is possible. Also, concentrating the lower auxiliary wiring placement in the central portion can reduce the voltage drop related issue with minimal number of lower auxiliary wirings in the organic light-emitting display device 300B.

In one embodiment, lower auxiliary wirings may be irregularly arranged across the substrate. The lower auxiliary wirings may be irregularly arranged at each random pixel.

Figure 3C:
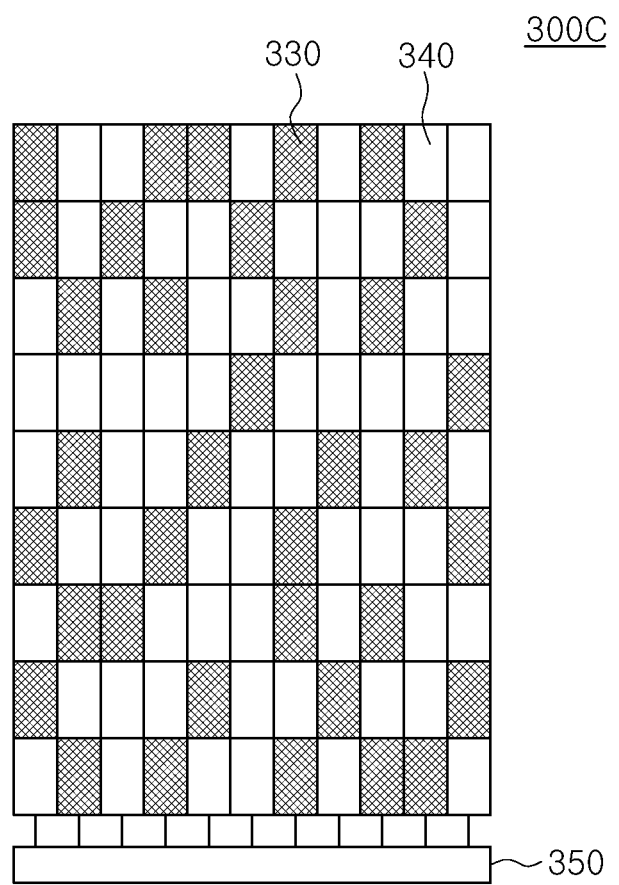

FIG. 3C illustrates that a plurality of sub-pixels 330 at which a lower auxiliary wiring is formed and a plurality of sub-pixels 340 at which a lower auxiliary wiring is not formed can be randomly arranged. Lower auxiliary wirings are randomly arranged at a plurality of sub-pixels of an organic light-emitting display device 300C. At each sub-pixel, a lower auxiliary wiring is electrically connected with a cathode. In this case, the lower auxiliary wiring is electrically connected with a voltage supply pad unit 350 and thus can be directly applied with a preset voltage.

Figure 4:
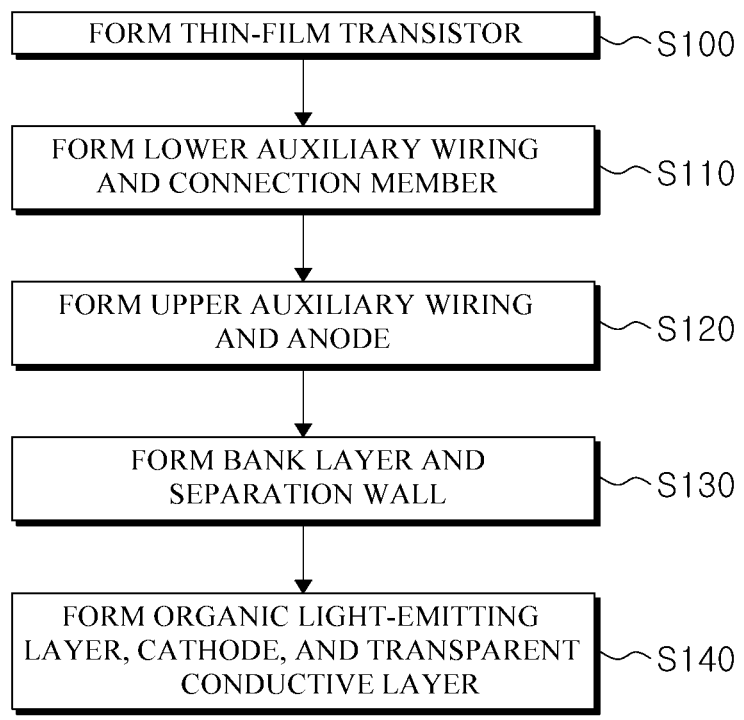
FIG. 4 is a flowchart of a method for manufacturing an organic light-emitting display device according to one embodiment.

FIG. 4 is a flowchart of a method for manufacturing an organic light-emitting display device according to one embodiment. FIG. 5A to FIG. 5E are cross-sectional views of respective processes provided for explaining a method for manufacturing an organic light-emitting display device according to one embodiment. Hereinafter, a method for manufacturing an organic light-emitting display device will be explained with reference to the flowchart of FIG. 4 and the cross-sectional views of respective processes of FIG. 5A to FIG. 5E.

Figure 5A:
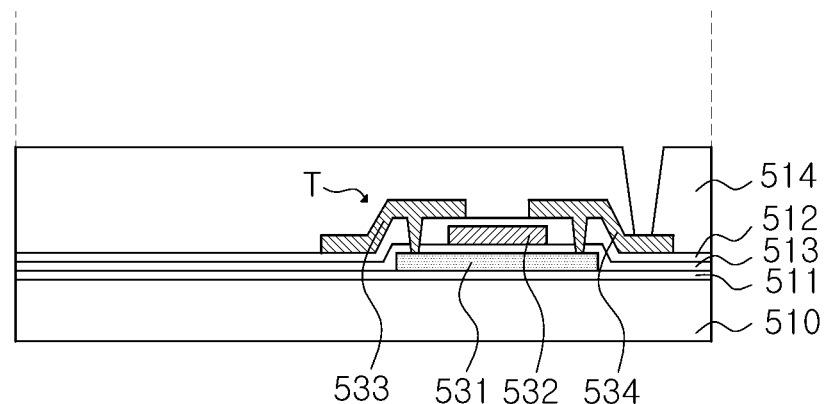
FIG. 5A to FIG. 5E are cross-sectional views of respective processes provided for manufacturing an organic light-emitting display device according to one embodiment.

Referring to FIG. 4, a thin-film transistor is formed on a substrate of an organic light-emitting display device (S100). Referring to FIG. 5A, a thin-film transistor T including an active layer 531, a gate electrode 532, a source electrode 533, and a drain electrode 534 is formed on a substrate 510.

The active layer 531 may be formed of amorphous silicon, polycrystalline silicon, or an oxide semiconductor. The gate insulating layer 513 is formed on the active layer 531.

The gate insulating layer 513 insulates the active layer 531 from the gate electrode 532. The gate insulating layer 513 is formed of, but not limited to, a silicon oxide layer, a silicon nitride layer, or a double layer thereof, and may be formed of various materials. The gate insulating layer 513 is formed including a contact-hole through which a portion of the active layer 531 is opened. A portion of a source region and a portion of a drain region of the active layer 531 are opened through the contact-hole.

The gate electrode 532 is formed on the gate insulating layer 513. The gate electrode 532 is overlapped with at least a part of the active layer 531, and particularly, with a channel region of the active layer 531. The gate electrode 532 is formed of, but not limited to, conductive materials, and particularly, of low-resistance metals, alloys of metals, or multilayers thereof, and may be formed of various materials in various layered structures.

The inter-insulating layer 512 is formed on the gate electrode 532. The inter-insulating layer 512 is formed of the same material as the gate insulating layer 513 and may be formed of, but not limited to, a silicon oxide layer, a silicon nitride layer, or a double layer thereof, and may be formed of various materials. The inter-insulating layer 512 is formed including a contact-hole through which a portion of the active layer 531 is opened. A portion of the source region and a portion of the drain region of the active layer 531 are opened through the contact-hole.

The source electrode 533 and the drain electrode 534 are formed on the inter-insulating layer 512. The source electrode 533 and the drain electrode 534 are electrically connected with the source region and the drain region, respectively, of the active layer 531 through the contact-holes formed at the inter-insulating layer 512 and the gate insulating layer 513. The source electrode 533 and the drain electrode 534 are formed of, but not limited to, conductive materials, and particularly, of low-resistance metals, alloys of metals, or multilayers thereof, and may be formed of various materials in various layered structures. A planarization layer 514 is formed on the thin-film transistor T, and a contact-hole through which a portion of the drain electrode 534 is opened is formed.

Figure 5B:
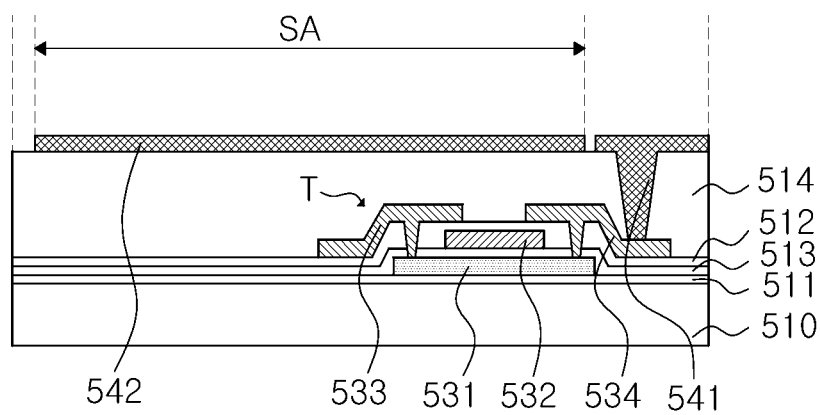

Hereinafter, a step of forming a lower auxiliary wiring and a connection member on the formed thin-film transistor will be explained (S110). Referring to FIG. 5B, a connection member 541 and a lower auxiliary wiring 542 are formed on the planarization layer 514, and the connection member 541 is electrically connected with the drain electrode 534 through the contact-hole. A region where the lower auxiliary wiring 542 is formed is defined as an auxiliary wiring area SA.

Figure 5C:
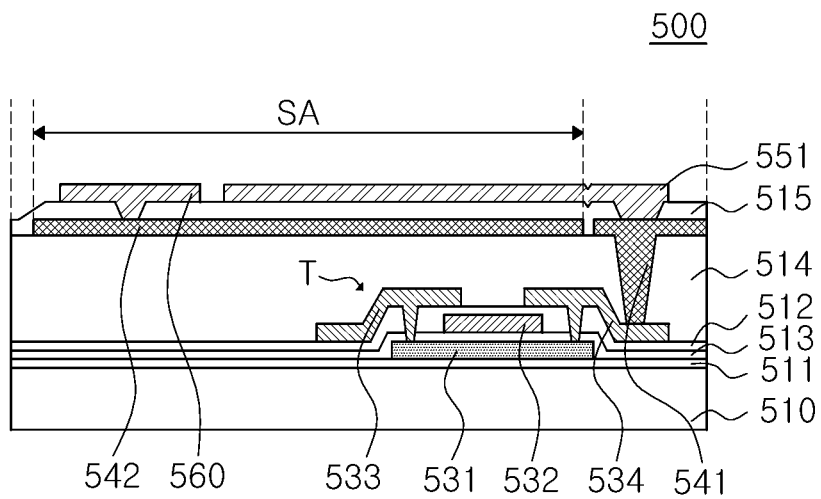

Then, referring to FIG. 4, an upper auxiliary wiring and an anode are formed (S120). Referring to FIG. 5C, an additional insulating layer 515 is formed on the lower auxiliary wiring 542 and the connection member 541, and an anode 551 and an upper auxiliary wiring 560 are formed on the additional insulating layer 515. The anode 551 is electrically connected with the connection member 541 through a contact-hole in the additional insulating layer 515. The upper auxiliary wiring 560 and the anode 551 are not electrically connected with each other and are spaced from each other.

Figure 5D:
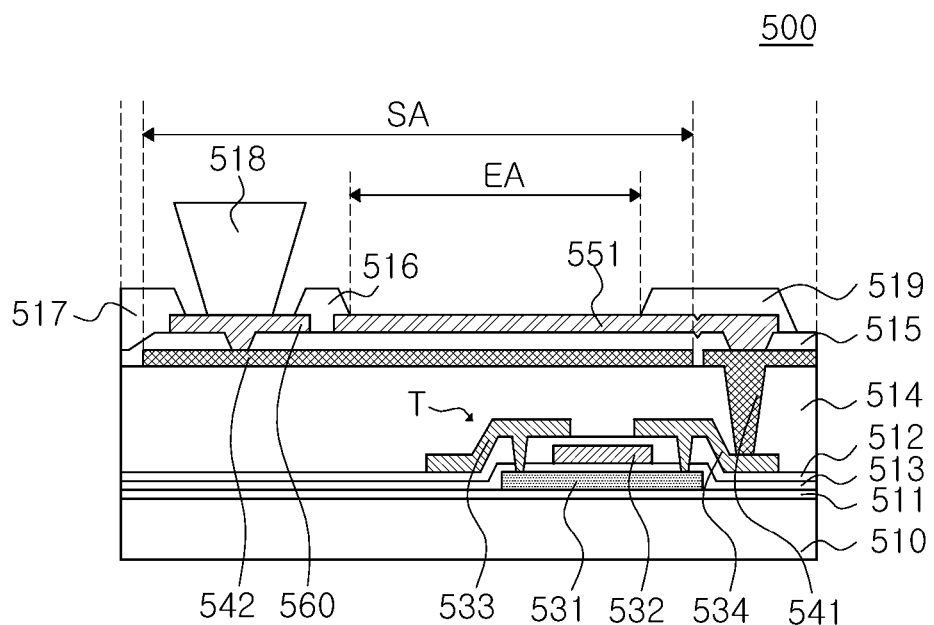

Then, referring to FIG. 4, bank layers and a separation wall are formed (S130). Referring to FIG. 5D, bank layers 516, 517, and 519 are formed on both sides of the anode 551 and both sides of the upper auxiliary wiring 560, and a separation wall 518 is formed on a region where the upper auxiliary wiring 560 is exposed. The bank layers 516, 517, and 519 may be formed in a tapered shape, and the separation wall 518 may be formed in a reverse tapered shape. In order to form a tapered or reverse tapered shape, a positive or negative-type photoresist may be adequately used. A light-emitting area EA is defined by the bank layers 516 and 519 within a range of the anode 551. The light-emitting area EA overlaps the lower auxiliary wiring 542.

Figure 5E:
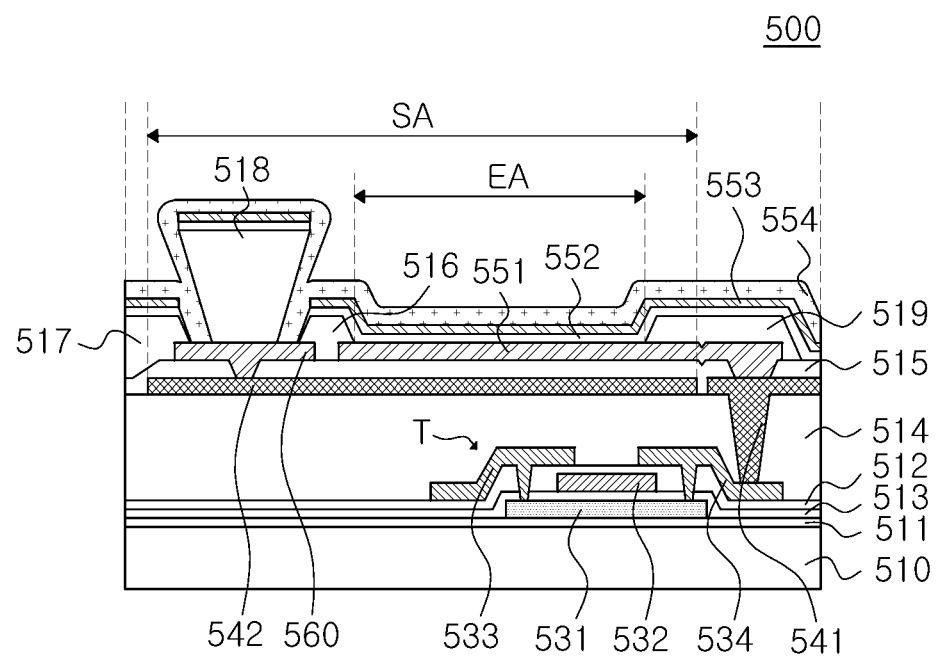

Further, referring to FIG. 4, an organic light-emitting layer, a cathode, and a transparent conductive layer are formed (S140). Referring to FIG. 5E, an organic light-emitting layer 552, a cathode 553, and a transparent conductive layer 554 are formed throughout a light-emitting area EA and an auxiliary wiring area SA. The organic light-emitting layer 552 and the cathode 553 are formed by depositing an organic light-emitting material and a cathode material above the substrate 510. The cathode 553 is electrically connected to lower auxiliary wiring 542 via the upper auxiliary wiring 560. When the organic light-emitting material and the cathode material are formed of materials with low step coverage, the organic light-emitting layer 552 and the cathode 553 may not be deposited on a portion of the upper auxiliary wiring 560 due to the separation wall 518.

The transparent conductive layer 554 is formed so as to connect the upper auxiliary wiring 560 with the cathode 553. Referring to FIG. 5E, the transparent conductive layer 554 is formed on the cathode 553, the upper auxiliary wiring 560, the bank layers 516 and 517, and the partition wall 518. The transparent conductive layer 554 is formed by depositing a transparent conductive oxide above the substrate 510. In general, the transparent conductive oxide is formed of a material with high step coverage. Therefore, the transparent conductive layer 554 is not severed by the separation wall 518 and is formed so as to cover a side surface and an upper surface of the separation wall 518. Consequently, the transparent conductive layer 554 connects the cathode 553 with the upper auxiliary wiring 560 in the auxiliary wiring area SA, thereby electrically connecting the cathode 553 with the lower auxiliary wiring 542. As described above, the lower auxiliary wiring 542 can be electrically connected with the cathode 533 by various methods in addition to the method of forming the separation wall 518.

Hereinafter, various embodiments of the organic light-emitting display device according to the present invention will be described.

In some embodiments, the organic light-emitting display device further comprises an additional insulating layer between the lower auxiliary wiring and the organic light-emitting element.

In some embodiments, the organic light-emitting display device further comprises an upper auxiliary wiring on the additional insulating layer electrically connected to the lower auxiliary wiring and the cathode.

In some embodiments, the upper auxiliary wiring is on the same plane with the anode.

In some embodiments, the organic light-emitting display device further comprises a connection member on the planarization layer electrically connected to the thin-film transistor and the anode.

In some embodiments, the connection member is on the same plane with the lower auxiliary wiring.

In some embodiments, the organic light-emitting display device includes a light-emitting area that overlaps with the lower auxiliary wiring.

In some embodiments, the organic light-emitting display device further comprises bank layers on the anode defining the light-emitting area.

In some embodiments, the thin-film transistor is electrically connected to the anode via a contact-hole of the planarization layer, and the one of the bank layers covers the contact-hole.

In some embodiments, the lower auxiliary wiring is not formed in a light-transmitting area.

In some embodiments, the organic light-emitting element emits light through the cathode.

In some embodiments, the organic light-emitting display device further comprises a transparent conductive layer on the cathode, the transparent conductive layer being in contact with the lower auxiliary wiring and the cathode.

In some embodiments, the lower auxiliary wiring is on a top surface of the planarization layer such that the lower auxiliary wiring is planar.

According to one embodiment, there is provided an organic light-emitting display device. The organic light-emitting display device comprises a thin-film transistor on a substrate, a planarization layer on the thin-film transistor, an organic light-emitting element on the planarization layer, and an auxiliary wiring between the planarization layer and the anode of organic light-emitting element. The organic light-emitting element includes an anode, an organic light-emitting layer, and a cathode and the auxiliary wiring being electrically connected to the cathode. The planarization layer has a thickness such that a parasitic capacitance between the thin-film transistor and the auxiliary wiring is 0.1 fF or less per unit area.

In some embodiments, the auxiliary wiring is configured to allow the parasitic capacitance generated between the auxiliary wiring and the thin-film transistor to be lower than a parasitic capacitance of a structure having the auxiliary wiring formed under the top surface of the planarization layer.

According to one embodiment, there is provided an organic light-emitting display device. The organic light-emitting display device comprises a planarization layer on a substrate, an organic light-emitting element on the planarization layer, and an auxiliary wiring between the planarization layer and the organic light-emitting element. The auxiliary wirings are periodically arranged across the substrate.

In some embodiments, the auxiliary wirings are periodically arranged such that the auxiliary wirings are disposed in each nth pixel, where n is an integer equal or larger than 1.

In some embodiments, a distance between two adjacent lower auxiliary wirings located in central portion of the organic light-emitting display is lower than a distance between two adjacent lower auxiliary wirings positioned in a peripheral portion of the organic light-emitting display device.

According to one embodiment, there is provided a method for manufacturing an organic light-emitting display device. The method for manufacturing an organic light-emitting display device comprises forming a thin-film transistor on a substrate, forming a planarization layer on the thin-film transistor, forming a lower auxiliary wiring on the planarization layer, forming an additional insulating layer on the lower auxiliary wiring, forming an anode on the additional insulating layer, forming bank layers on the anode, the bank layers defining a light-emitting area that overlaps the lower auxiliary wiring, and forming an organic light-emitting layer and a cathode on the anode.

In some embodiments, a method for manufacturing an organic light-emitting display device further comprises forming an upper auxiliary wiring electrically connecting the lower auxiliary wiring and the cathode, wherein the upper auxiliary wiring is formed simultaneously with the anode.

In some embodiments, a method for manufacturing an organic light-emitting display device further comprises forming a connection member electrically connecting a source or a drain electrode of the thin-film transistor and anode, wherein the connection member is formed simultaneously with the lower auxiliary wiring.

The present disclosure has been described in more detail with reference to the exemplary embodiments, but the present disclosure is not limited to the exemplary embodiments. It will be apparent to those skilled in the art that various modifications can be made without departing from the technical sprit of the invention. Accordingly, the exemplary embodiments disclosed in the present disclosure are used not to limit but to describe the technical spirit of the present disclosure, and the technical spirit of the present disclosure is not limited to the exemplary embodiments. Therefore, the exemplary embodiments described above are considered in all respects to be illustrative and not restrictive. The protection scope of the present disclosure must be interpreted by the appended claims and it should be interpreted that all technical spirits within a scope equivalent thereto are included in the appended claims of the present disclosure.

What is claimed is:

1. An organic light-emitting display device comprising:
   a thin-film transistor formed on a substrate;
   a planarization layer on the thin-film transistor;
   an organic light-emitting element on the planarization layer, the organic light-emitting element including an anode, an organic light-emitting layer, and a cathode;
   a lower auxiliary wiring electrically connected to the cathode without being in direct contact with the cathode, wherein the lower auxiliary wiring is disposed between the organic light-emitting element and the planarization layer;
   a separation wall above the lower auxiliary wiring and the anode, formed of an organic insulating material and configured to separate the organic light-emitting layer from an organic light-emitting layer of an adjacent sub-pixel, the separation wall having a reverse tapered shape, wherein a portion of the separation wall is above the cathode and the organic light-emitting layer of the organic light-emitting element; and
   a transparent conductive layer directly on the cathode and covering the separation wall, the transparent conductive layer electrically connecting the lower auxiliary wiring and the cathode.

2. The organic light-emitting display device according to claim 1, further comprising:
   an additional insulating layer between the lower auxiliary wiring and the organic light-emitting element.

3. The organic light-emitting display device according to claim 2, further comprising:
   an upper auxiliary wiring on the additional insulating layer electrically connected to the lower auxiliary wiring and the cathode.

4. The organic light-emitting display device according to claim 3, wherein the upper auxiliary wiring is on a same plane with the anode.

5. The organic light-emitting display device according to claim 1, further comprising:
   a connection member on the planarization layer electrically connected to the thin-film transistor and the anode.

6. The organic light-emitting display device according to claim 5, wherein the connection member is on a same plane with the lower auxiliary wiring.

7. The organic light-emitting display device according to claim 1, wherein the organic light-emitting display device includes a light-emitting area that entirely overlaps with the lower auxiliary wiring such that the light-emitting area is within an area of the lower auxiliary wiring.

8. The organic light-emitting display device according to claim 7, further comprising:
   bank layers on the anode defining the light-emitting area.

9. The organic light-emitting display device according to claim 8, wherein the thin-film transistor is electrically connected to the anode via a contact-hole of the planarization layer, and one of the bank layers covers the contact-hole.

10. The organic light-emitting display device according to claim 7, wherein the lower auxiliary wiring is not formed in a light-transmitting area.

11. The organic light-emitting display device according to claim 1, wherein the organic light-emitting element emits light through the cathode.

12. The organic light-emitting display device according to claim 1, wherein the lower auxiliary wiring is on a top surface of the planarization layer such that the lower auxiliary wiring is planar.

13. An organic light-emitting display device comprising:
    a thin-film transistor on a substrate;
    a planarization layer on the thin-film transistor including a gate electrode, a first electrode and a second electrode;
    an organic light-emitting element on the planarization layer, the organic light-emitting element including an anode, an organic light-emitting layer, and a cathode; and
    an auxiliary wiring over the thin-film transistor and between the planarization layer and the anode of organic light-emitting element, the auxiliary wiring being electrically connected to the cathode,
    a separation wall above the auxiliary wiring and the anode, formed of an organic insulating material and configured to separate the organic light-emitting layer from an organic light-emitting layer of an adjacent sub-pixel, the separation wall having a reverse tapered shape, wherein a portion of the separation wall is above the cathode and the organic light-emitting layer of the organic light-emitting element; and
    a connection member on the planarization layer electrically connected to one of the first electrode or the second electrode of the thin-film transistor and the anode, wherein the planarization layer has a thickness such that a parasitic capacitance between the thin-film transistor and the auxiliary wiring is 0.1 fF or less per unit area, and wherein the planarization layer is formed of one or more materials of a polyacrylates resin, an epoxy resin, a phenolic resin, a polyamides resin, a polyimides resin, an unsaturated polyesters resin, a poly-phenylenethers resin, a poly-phenylenesulfides resin, or benzocyclobutene, and wherein the connection member has an upper portion on a same plane with the auxiliary wiring.

14. The organic light-emitting display device according to claim 13, wherein the auxiliary wiring is configured to allow the parasitic capacitance generated between the auxiliary wiring and the thin-film transistor to be lower than a parasitic capacitance of a structure having the auxiliary wiring formed under the top surface of the planarization layer.

15. A method for manufacturing an organic light-emitting display device, comprising:
   forming a thin-film transistor on a substrate;
   forming a planarization layer on the thin-film transistor;
   forming a lower auxiliary wiring and a connection member on the planarization layer, wherein the connection member electrically connects a source electrode or a drain electrode of the thin-film transistor and the anode, and wherein the connection member is on a same plane with the lower auxiliary wiring;
   forming an additional insulating layer on the lower auxiliary wiring; forming an anode on the additional insulating layer;
   forming bank layers and a separation wall above the anode, the bank layers defining a light-emitting area that overlaps the lower auxiliary wiring and the separation wall formed in a reverse tapered shape;
   forming an organic light-emitting layer and a cathode on the anode; and forming a transparent conductive layer directly on the cathode, the transparent conductive layer electrically connecting the lower auxiliary wiring and the cathode;
   wherein the lower auxiliary wiring is electrically connected with the cathode without being in direct contact with the cathode, and wherein the separation wall is formed such that a portion of the separation wall is above the cathode and the organic light-emitting layer.

16. The method according to claim 15, further comprising;
   forming an upper auxiliary wiring electrically connecting the lower auxiliary wiring and the cathode, wherein the upper auxiliary wiring is formed simultaneously with the anode.

17. The method of claim 15, wherein the light-emitting area entirely overlaps with an area of the lower auxiliary wiring.

18. An organic light-emitting display device comprising:
   a thin-film transistor formed on a substrate;
   a planarization layer on the thin-film transistor including a gate electrode, a first electrode and a second electrode;
   an organic light-emitting element on the planarization layer, the organic light-emitting element including an anode, an organic light-emitting layer, and a cathode;
   a connection member on the planarization layer that is electrically connected to one of the first electrode or the second electrode of the thin-film transistor and the anode;
   bank layers and a separation wall above the anode, the bank layers defining a light-emitting area of the organic light-emitting display device and the separation wall formed in a reverse tapered shape so as to sever the organic light-emitting element, wherein a portion of the separation wall is above the cathode and the organic light-emitting layer of the organic light-emitting element;
   a lower auxiliary wiring electrically connected to the cathode without being in direct contact with the cathode;
   an additional insulating layer between the lower auxiliary wiring and the organic light-emitting element; and
   an upper auxiliary wiring on the additional insulating layer, wherein the upper auxiliary wiring electrically connects together the cathode and the lower auxiliary wiring, wherein the connection member has an upper portion on a same plane with the lower auxiliary wiring.

19. The organic light-emitting display device according to claim 18, wherein the upper auxiliary wiring is in direct contact with the lower auxiliary wiring.

* * * * *